(12) United States Patent
Liu et al.

(10) Patent No.: US 6,834,711 B2
(45) Date of Patent: Dec. 28, 2004

(54) HEAT-RADIATING STRUCTURE WITH LOW HEIGHT

(76) Inventors: Ming-Hwa Liu, No. 117, Chung Chun Rd., Pei Tou Chen, Chang Hua Hsien (TW); Brian D. F. Chen, No. 205, Li Der Street, East District, Taichung (TW); Cheng Paug Chang, No. 36-2, Ting-Yuan Lin, Ta Lin Chen, Chia Yih Hsien (TW)

( * ) Notice: Subject to any disclaimer, the term of this patent is extended or adjusted under 35 U.S.C. 154(b) by 0 days.

(21) Appl. No.: 10/425,954

(22) Filed: Apr. 30, 2003

(65) Prior Publication Data

US 2003/0205369 A1 Nov. 6, 2003

(30) Foreign Application Priority Data

May 2, 2002 (TW) ........................................ 091206100

(51) Int. Cl.$^7$ ................................................. H05K 7/20
(52) U.S. Cl. ........................ 165/80.3; 165/185; 361/704
(58) Field of Search .............................. 165/80.3, 185; 361/697, 704, 710; 174/16.3; 257/719, 722

(56) References Cited

U.S. PATENT DOCUMENTS

| 1,527,736 | A | * | 2/1925 | Karmazin | ................... 165/151 |
|---|---|---|---|---|---|
| 1,704,539 | A | * | 3/1929 | Karmazin | ............... 29/890.039 |
| 1,940,804 | A | * | 12/1933 | Karmazin | ................... 165/151 |
| 2,045,657 | A | * | 6/1936 | Karmazin | ................... 165/151 |
| 2,171,253 | A | * | 8/1939 | Day | ........................... 165/181 |
| 5,318,112 | A | * | 6/1994 | Gopin | ........................ 165/151 |
| 5,529,120 | A | * | 6/1996 | Howard et al. | ............. 165/166 |
| 5,960,863 | A | * | 10/1999 | Hua | ......................... 165/80.3 |
| 6,267,178 | B1 | * | 7/2001 | Chen | .......................... 165/185 |
| 6,450,250 | B2 | * | 9/2002 | Guerrero | ............... 165/104.33 |

* cited by examiner

*Primary Examiner*—Allen J. Flanigan
(74) *Attorney, Agent, or Firm*—Troxell Law Office PLLC

(57) ABSTRACT

A heat-radiating structure with low height, including a first heat-radiating plate and a second heat-radiating plate spaced above the first heat-radiating plate. The first heat-radiating plate is formed with multiple first perforations arranged at intervals and multiple first dents arranged at intervals and extending downward. The second heat-radiating plate is formed with multiple second perforations arranged at intervals and multiple second dents extending downward and fitted with the first perforations. A heat-generating body such as a CPU is adjacent to outer sides of the bottoms of the first and second dents. The heat-radiating structure has a height much smaller than that of a conventional vertical heat-radiating plate and a heat conducting area much larger than that of the vertical heat-radiating plate. Accordingly, the heat-radiating structure can achieve better heat-radiating effect and is applicable to those products having small internal space and necessitating heat-radiation, such as a portable computer.

16 Claims, 6 Drawing Sheets

HEAT-RADIATING STRUCTURE WITH LOW HEIGHT

BACKGROUND OF THE INVENTION

The present invention is related to a heat exchange device, and more particularly to a heat-radiating structure for a heat-generating body with small space, such as a CPU of a portable computer or a personal digital assistant (PDA).

It is a trend to develop various kinds of small-size and lightweight electronic products such as desktop computer, portable computer, PDA, mobile phone and intelligent electric appliance. These electronic products can be conveniently carried and readily used.

The above product includes a CPU and peripheral electronic elements which will generate much heat in operation. The heat will affect the operation efficiency and shorten the using life of the product. Therefore, it is necessary to lower the temperature of the CPU and the electronic elements.

Conventionally, a set of heat conductive plates and a fan are disposed on outer side of the CPU to conduct and dissipate the heat generated by the CPU. The heat conductive plates are vertically arranged at intervals. Such arrangement will occupy much space and the heat-radiating effect is limited and insufficient for the high temperature caused by high frequency operation of the CPU.

SUMMARY OF THE INVENTION

It is therefore a primary object of the present invention to provide a heat-radiating structure with low height, which is able to effectively conduct the heat generated by a heat-generating body and lower the temperature thereof.

It is a further object of the present invention to provide the above heat-radiating structure with low height so as to meet the requirement of lightweight, thinness, shortness and small size.

According to the above objects, the heat-radiating structure of the present invention includes a first heat-radiating plate and a second heat-radiating plate spaced above the first heat-radiating plate. The first heat-radiating plate is formed with multiple first perforations arranged at intervals and multiple first dents arranged at intervals and extending downward. The second heat-radiating plate is formed with multiple second perforations arranged at intervals and multiple second dents extending downward and fitted with the first perforations.

The present invention can be best understood through the following description and accompanying drawings wherein:

DETAILED DESCRIPTION OF THE PREFERRED EMBODIMENTS

Figure 1:
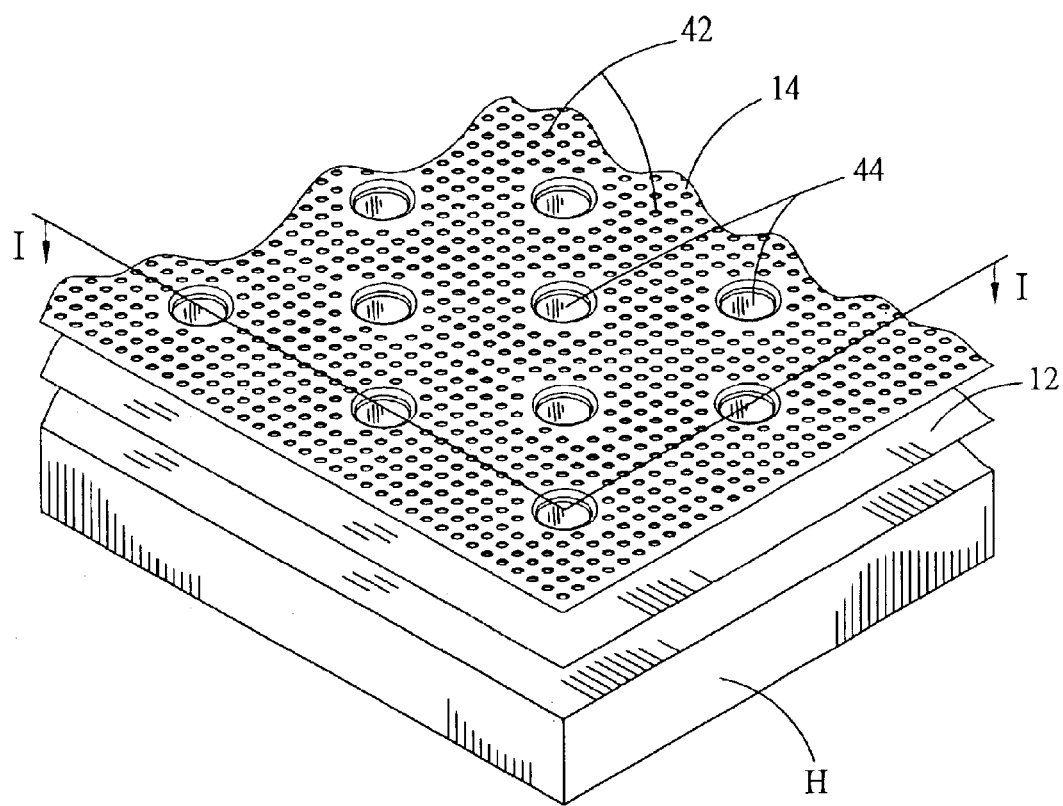
FIG. 1 is a perspective view of a part of a first embodiment of the heat-radiating structure of the present invention, showing that the heat-radiating structure is disposed on a heat-generating body.
Figure 2:
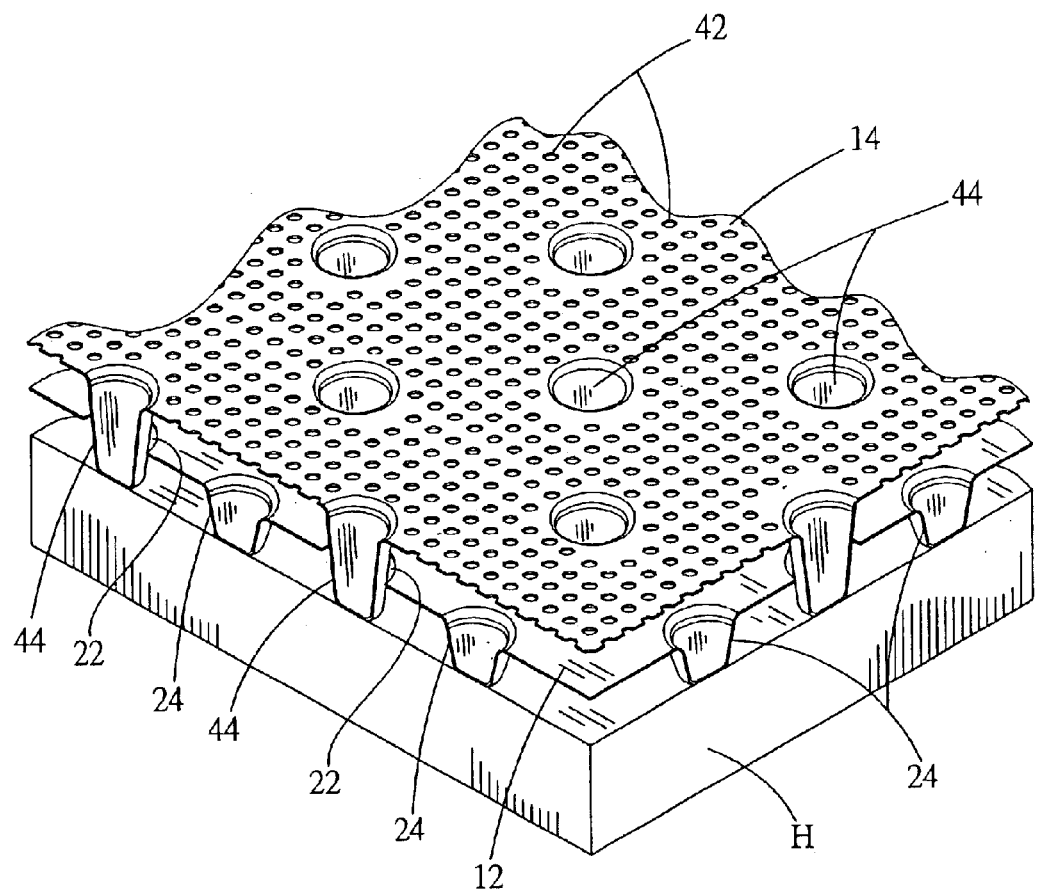
FIG. 2 is a sectional view taken along line I—I of FIG. 1.

Please refer to FIGS. 1 and 2. The heat-radiating structure with low height of the present invention includes a first heat-radiating plate 12 and a second heat-radiating plate 14.

The first heat-radiating plate 12 is formed with multiple first perforations 22 arranged at intervals and multiple first dents 24 arranged at intervals and extending downward.

The second heat-radiating plate 14 is spaced above the first heat-radiating plate 12. The second heat-radiating plate 14 is formed with multiple second perforations 42 arranged at intervals and multiple second dents 44 extending downward and fitted with the first perforations 22.

The outer sides of bottom faces of the first and second dents 24, 44 are attached to a heat-generating body H. The heat generated by the heat-generating body H is conducted by the first and second dents 24, 44 to the first and second heat-radiating plates 12, 14.

According to the above arrangement, the present invention has the advantages as follows:

1. The heat-radiating structure of the present invention has low height.
2. By means of the design of the first and second dents 24, 44, the contact area between the heat-radiating structure and the heat-generating body is several times the contact area of the conventional heat-radiating structure. Therefore, the present invention has very good heat-radiating efficiency.

Figure 3:
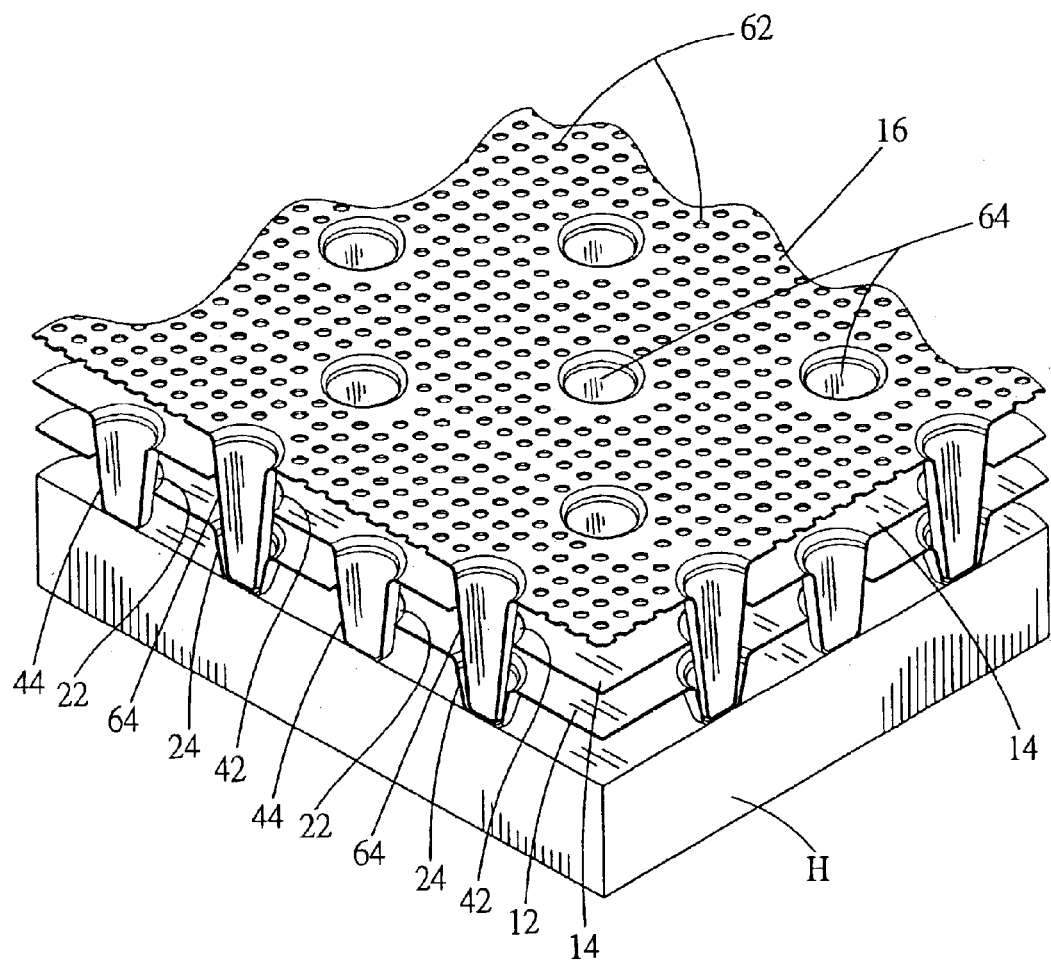
FIG. 3 is a sectional perspective view of a part of a second embodiment of the heat-radiating structure of the present invention, showing that the heat-radiating structure is disposed on a heat-generating body.

Referring to FIG. 3, the present invention further includes a third heat-radiating plate 16 and the second perforations 42 are positioned corresponding to the first dents 24.

The third heat-radiating plate 16 is spaced above the second heat-radiating plate 14. The third heat-radiating plate 16 is formed with multiple third perforations 62 arranged at intervals and multiple third dents 64 extending downward and fitted with the second perforations 42. Accordingly, the heat-radiating area is further increased to enhance the heat-radiating efficiency, while only increasing small height.

Figure 4:
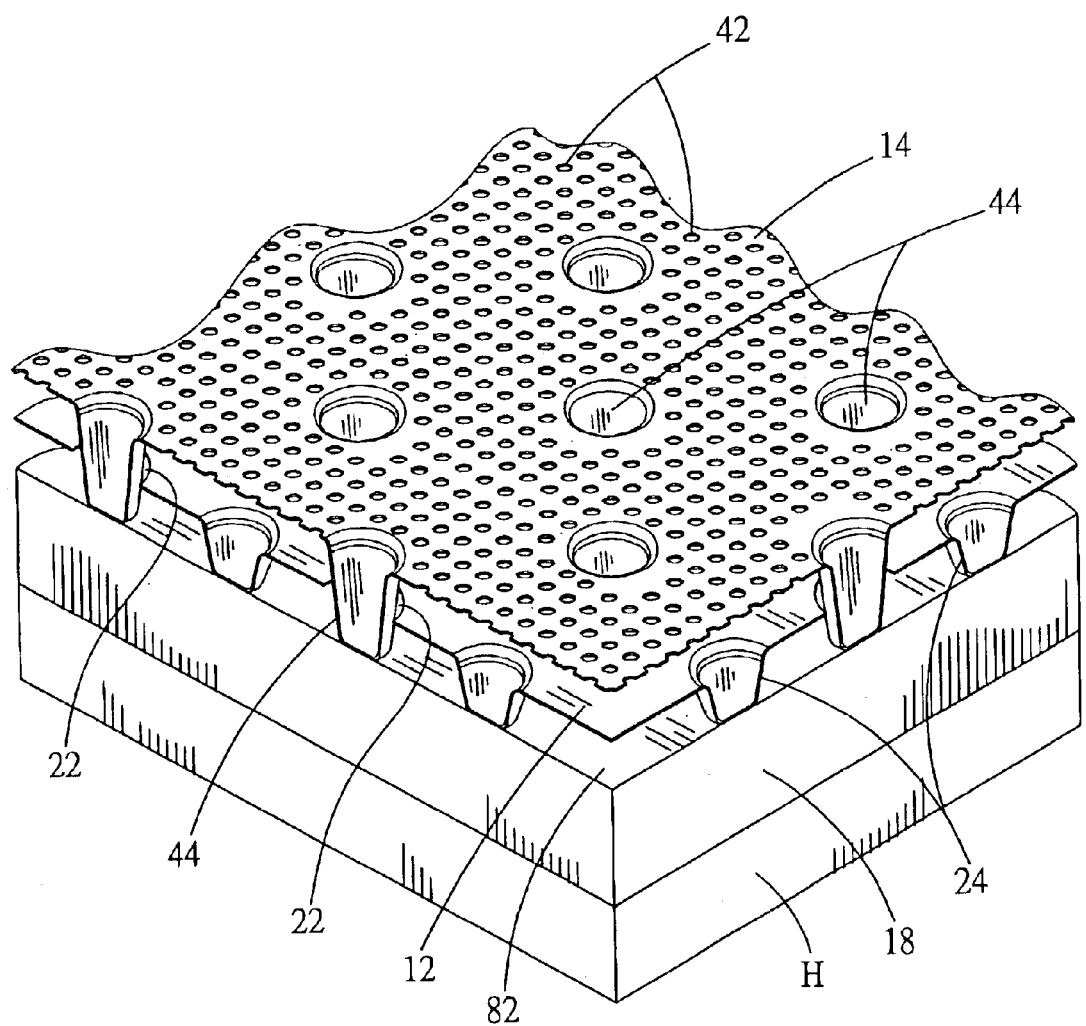
FIG. 4 is a sectional perspective view of a part of a third embodiment of the heat-radiating structure of the present invention, showing that the heat-radiating structure is disposed on a heat-generating body.

Referring to FIG. 4, the present invention further includes a heat conductive body 18 positioned under the first heat-radiating plate 12 to attach to the heat-generating body H. The heat conductive body 18 has a surface 82 facing the first heat-radiating plate 12. The outer sides of the bottoms of the first and second dents 24, 44 attach to the surface 82 to achieve the same effect.

The outer side of the bottom of each third dent 64 attaches to the inner side of the bottom of each first dent 24.

The inner edge of at least one first perforation 22 is spaced from the outer side of the corresponding second dent 44 to form a passage for enhancing the convection of thermal fluid such as air and thus enhancing heat-radiating efficiency, especially in the case that a fan is disposed above the present invention.

In the structure of the present invention with the third heat-radiating plate 16, the inner edge of at least one second perforation 42 is spaced from the outer side of the corresponding third dent 64.

Figure 5:
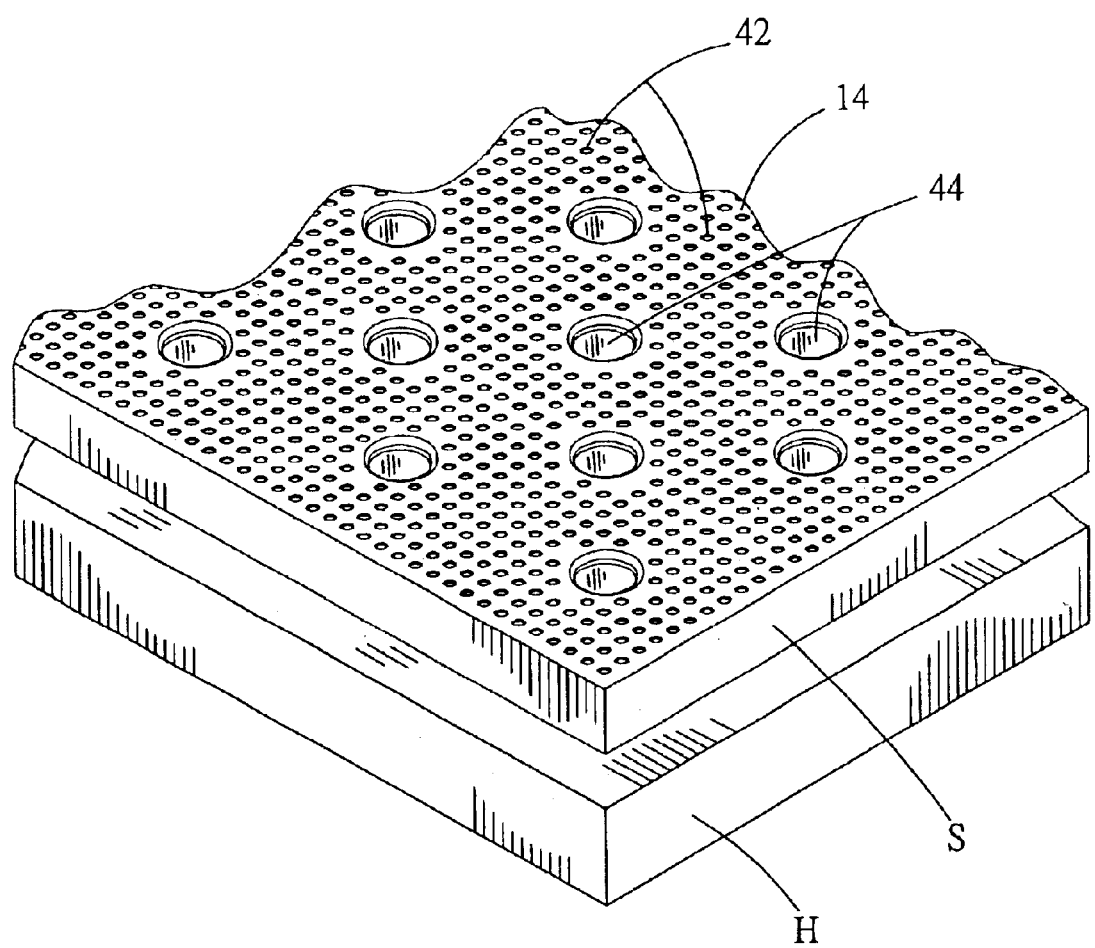
FIG. 5 is a perspective view of a part of a fourth embodiment of the heat-radiating structure of the present invention, showing that the heat-radiating structure is disposed on a heat-generating body.

Referring to FIG. 5, in the embodiment of FIG. 1, in the case that the inner edge of at least one first perforation 22 is spaced from the outer side of the corresponding second dent 44, the embodiment further includes a surrounding plate S fixedly disposed on outer ends of the first and second heat-radiating plates 12, 14 for enclosing the periphery between the first and second heat-radiating plates 12, 14. Accordingly, the present invention also achieves a convection effect of thermodynamics.

Figure 6:
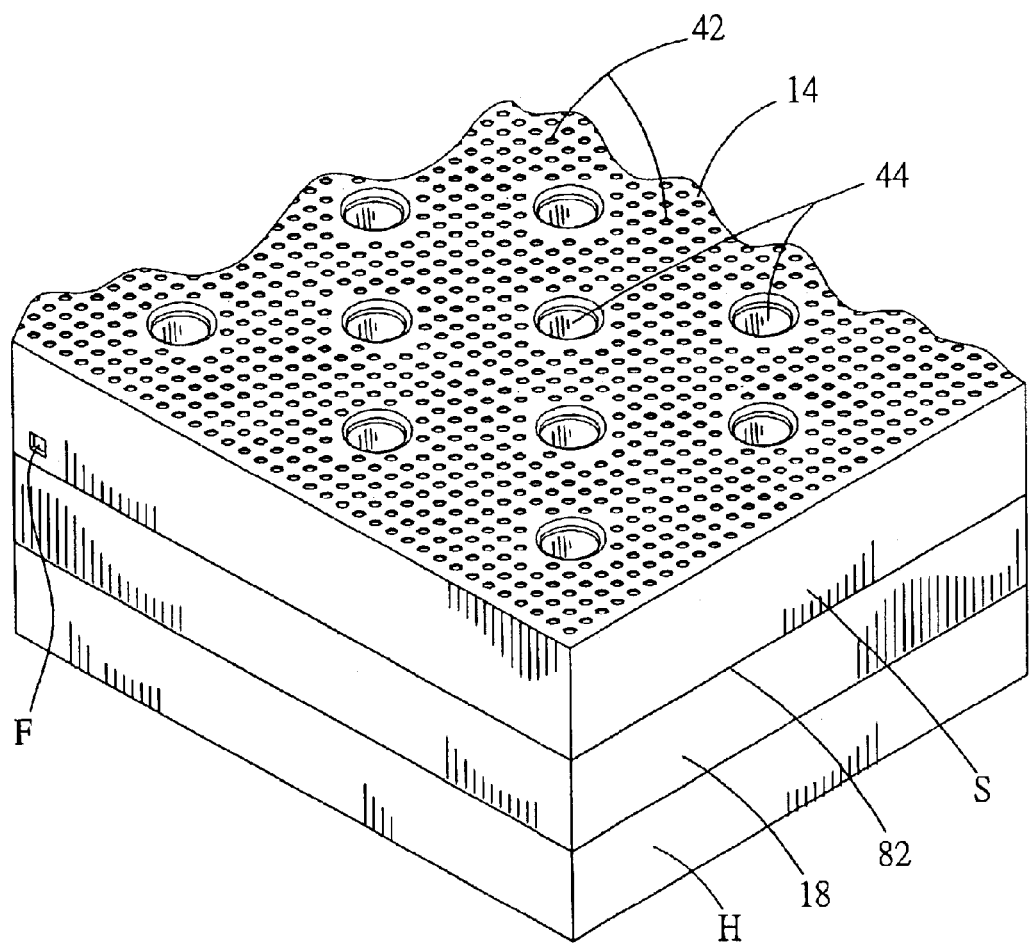
FIG. 6 is a perspective view of a part of a fifth embodiment of the heat-radiating structure of the present invention, showing that the heat-radiating structure is disposed on a heat-generating body.

Referring to FIG. 6, in the embodiment of FIG. 4, in the case that the inner edge of at least one first perforation 22 is spaced from the outer side of the corresponding second dent 44, the embodiment further includes a surrounding plate S and at least one fluid hole F.

The surrounding plate S is fixedly disposed on outer ends of the first heat-radiating plate 12 (not shown in FIG. 6), the second heat-radiating plate 14 and the surface 82 for enclosing the periphery between the first and second heat-radiating plates 12, 14 and the heat conductive body 18. The fluid hole F is formed on the surrounding plate S (such as between the surface 82 and the first heat-radiating plate 12 ). Furthermore, the second perforations 42 communicate with the fluid hole F. Accordingly, the present invention can serve as a heat-radiating structure providing circulation of cooling liquid such as water.

The structure of FIGS. 5 and 6 can further include the third heat-radiating plate 16 to serve as a heat-radiating structure achieving a convection effect of thermodynamics and providing circulation of cooling liquid such as water.

In the structure of the present invention, the first dents 24 are spirally arranged to conduct the fluid.

In the structure of the present invention, the second dents 44 are spirally arranged.

In the structure of the present invention, the third dents 64 are spirally arranged.

In the structure of the present invention, the surface 82 is formed with multiple protuberances arranged at intervals for effectively detaining a fluid such as air or water so as to fully perform heat exchange.

An identical structure of the present invention can be added to the upper side of the above structure to enhance the heat-radiating efficiency.

The above embodiments are only used to illustrate the present invention, not intended to limit the scope thereof. Many modifications of the above embodiments can be made without departing from the spirit of the present invention.

What is claimed is:

1. A heat-radiating structure with low height, comprising:
  a first heat-radiating plate formed with multiple first perforations arranged at intervals and multiple first dents arranged at intervals and extending downward;
  a second heat-radiating plate spaced above the first heat-radiating plate, the second heat-radiating plate being formed with multiple second perforations arranged at intervals and multiple second dents extending downward and fitted with the first perforations; and
  a heat conductive body positioned under the first heat-radiating plate, the heat conductive body having a surface facing the first heat-radiating plate, outer sides of the bottoms of the first and second dents attaching to the surface.

2. The heat-radiating structure with low height as claimed in claim 1, further comprising a third heat-radiating plate, wherein the second perforations are positioned corresponding to the first dents, the third heat-radiating plate being space above the second heat-radiating plate, the third heat-radiating plate being formed with multiple third perforations arranged at intervals and multiple third dents extending downward and fitted with the second perforations.

3. The heat-radiating structure with low height as claimed in claim 2, wherein outer side of the bottom of each third dent attaches to inner side of the bottom of each first dent.

4. The heat-radiating structure with low height as claimed in claim 1, wherein inner edge of at least one first perforation is spaced from the outer side of the corresponding second dent.

5. The heat-radiating structure with low height as claimed in claim 2, wherein inner edge of at least one first perforation is spaced from the outer side of the corresponding second dent and inner edge of at least one second perforation is spaced from the outer side of the corresponding third dent.

6. The heat-radiating structure with low height as claimed in claim 3, inner edge of at least one first perforation is spaced from the outer side of the corresponding second dent and inner edge of at least one second perforation is spaced from the outer side of the corresponding third dent and inner side of at least one first dent is spaced from the outer side of the corresponding third dent.

7. The heat-radiating structure with low height as claimed in claim 4, further comprising a surrounding plate and at least one fluid hole, the surrounding plate being fixedly disposed on outer ends of the first heat-radiating plate, the second heat-radiating plate and the surface, the fluid hole being formed on the surrounding plate.

8. The heat-radiating structure with low height as claimed in claim 7, wherein the fluid hole is formed between the surface and the first heat-radiating plate.

9. The heat-radiating structure with low height as claimed in claim 5, further comprising a surrounding plate and at least one fluid hole, the surrounding plate being fixedly disposed on outer ends of the first, second and third heat-radiating plates and the outer end of the surface, the fluid hole being formed on the surrounding plate.

10. The heat-radiating structure with low height as claimed in claim 6, wherein the fluid hole is formed between the surface and the first heat-radiating plate.

11. The heat-radiating structure with low height as claimed in claim 6, further comprising a surrounding plate and at least one fluid hole, the surrounding plate being fixedly disposed on outer ends of the first, second and third heat-radiating plates and the outer end of the surface, the fluid hole being formed on the surrounding plate.

12. The heat-radiating structure with low height as claimed in claim 11, wherein the fluid hole is formed between the surface and the first heat-radiating plate.

13. A heat-radiating structure with low height, comprising:
  a first heat-radiating plate formed with multiple first perforations arranged at intervals and multiple first dents arranged at intervals and extending downward;
  a second heat-radiating elate spaced above the first heat-radiating plate, the second heat-radiating plate being formed with multiple second perforations arranged at intervals and multiple second dents extending downward and fitted with the first perforations; wherein an inner edge of at least one of the multiple first perforations is spaced from the outer side of the corresponding second dent; and
  a surrounding plate fixedly disposed on outer ends of the first and second heat-radiating plates for enclosing the periphery between the first and second heat-radiating plates.

14. A heat-radiating structure with low height, comprising:
  a first heat-radiating plate formed with multiple first perforations arranged at intervals and multiple first dents arranged at intervals and extending downward; and a second heat-radiating plate spaced above the first heat-radiating plate, the second heat-radiating plate being formed with multiple second perforations arranged at intervals and multiple second dents extending downward and fitted with the first perforations:

wherein the first dents are spirally arranged.

15. A heat-radiating structure with low height, comprising:

a first heat-radiating plate formed with multiple first perforations arranged at intervals and multiple first dents arranged at intervals and extending downward; and a second heat-radiating plate spaced above the first heat-radiating plate, the second heat-radiating plate being formed with multiple second perforations arranged at intervals and multiple second dents extending downward and fitted with the first perforations;

wherein the second dents are spirally arranged.

16. The heat-radiating structure with low height as claimed in claim 1, wherein the surface is formed with multiple protuberances arranged at intervals.

* * * * *